United States Patent
Osada et al.

(10) Patent No.: US 6,639,630 B2
(45) Date of Patent: Oct. 28, 2003

(54) TV-SIGNAL RECEIVING TUNER WITH REDUCED EXTRANEOUS EMISSION

(75) Inventors: Shigeru Osada, Fukushima-ken (JP); Masaki Yamamoto, Fukushima-ken (JP); Yoshihiro Sato, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 09/494,960

(22) Filed: Feb. 1, 2000

(65) Prior Publication Data

US 2003/0174254 A1 Sep. 18, 2003

(30) Foreign Application Priority Data

Feb. 4, 1999 (JP) ............................. 11-027373

(51) Int. Cl.$^7$ ............................. H04N 5/44; H04N 5/50
(52) U.S. Cl. ...................... 348/731; 348/732; 348/725; 348/705; 348/706
(58) Field of Search ................. 348/731, 732, 348/733, 725, 729, 723, 705, 706; 334/15, 47; 455/176.1, 179.1, 180.1, 180.2

(56) References Cited

U.S. PATENT DOCUMENTS

| | | | | |
|---|---|---|---|---|
| 4,499,495 A | * | 2/1985 | Strammello | 348/706 |
| 5,014,349 A | * | 5/1991 | Kubo et al. | 348/731 |
| 5,115,317 A | * | 5/1992 | Igarashi et al. | 348/725 |
| 6,160,572 A | * | 12/2000 | Matsuura | 348/731 |
| 6,236,437 B1 | * | 5/2001 | Suzuki et al. | 343/720 |
| 6,243,567 B1 | * | 6/2001 | Saito | 348/731 |
| 6,307,600 B1 | * | 10/2001 | Wink | 348/554 |
| 6,392,715 B1 | * | 5/2002 | Sato et al. | 348/505 |

FOREIGN PATENT DOCUMENTS

| | | |
|---|---|---|
| EP | 0 348 697 A | 1/1990 |
| EP | 0 851 580 A1 | 7/1998 |
| FR | 2 367 394 A | 5/1978 |
| FR | 2 454 237 A | 11/1980 |
| JP | 60136408 | 7/1985 |
| JP | 06 121249 A | 4/1994 |
| JP | 10-233708 | 9/1998 |
| JP | 10-271401 | 10/1998 |

\* cited by examiner

*Primary Examiner*—John Miller
*Assistant Examiner*—Jean W. Desir
(74) *Attorney, Agent, or Firm*—Brinks Hofer Gilson & Lione

(57) ABSTRACT

A switch circuit is provided for at least one of a previous stage of a VHF-band frequency converter and a previous stage of a UHF-band frequency converter. Each switch circuit passes a signal when a frequency converter at a subsequent stage of the switch circuit is operating, and does not pass a signal when the frequency converter at the subsequent stage of the switch circuit is not operating.

3 Claims, 4 Drawing Sheets

TV-SIGNAL RECEIVING TUNER WITH REDUCED EXTRANEOUS EMISSION

BACKGROUND OF THE INVENTION

1. Field of the Invention

The present invention relates to TV-signal receiving tuners, and more particularly, to a TV-signal receiving tuner for both VHF and UHF frequency bands, which prevents an oscillation signal of a local oscillator in the TV-signal receiving tuner from leaking.

2. Description of the Related Art

FIG. 6 shows a conventional TV-signal receiving tuner. This V-U integrated-type TV-signal receiving tuner is formed by integrating a VHF-band TV-signal receiving tuner and a UHF-band TV-signal receiving tuner into one unit, and includes a VHF-band input terminal 31, a VHF-band high-frequency circuit section 32, a VHF-band frequency converter 33, a UHF-band input terminal 34, a UHF-band high-frequency circuit section 35, a UHF-band frequency converter 36, an intermediate-frequency amplifier 37, a band switcher 38, and an output terminal 39. The VHF-band frequency converter 33 has a VHF-band mixer 40 and a VHF-band local oscillator 41. The UHF-band frequency converter 36 has a UHF-band mixer 42 and a UHF-band local oscillator 43.

The VHF-band high-frequency circuit section 32 includes a high-frequency amplifier, a tuning circuit, and a filter none of them are shown), selects a VHF-band TV signal to be received, and amplifies it.

In the same way, the UHF-band high-frequency circuit section 35 includes a high-frequency amplifier, a tuning circuit, and a filter (none of them are shown), selects a UHF-band TV signal to be received, and amplifies it.

The band switcher 38 is connected to the VHF-band frequency converter 33 and to the UHF-band frequency converter 36, and supplies a switching voltage to one of the VHF-band frequency converter 33 and the UHF-band frequency converter 36 according to the band to be received. When a VHF-band TV signal is to be received, the switching voltage is generated only at a first control terminal 44, the switching voltage is supplied to the VHF-band frequency converter 33, the VHF-band frequency converter 33 is set to an operating state, and the UHF-band frequency converter 36 is set to a not-operating state. When a UHF-band TV signal is to be received, the switching voltage is generated only at a second control terminal 45, the switching voltage is supplied to the UHF-band frequency converter 36, the UHF-band frequency converter 36 is set to an operating state, and the VHF-band frequency converter 33 is set to a not-operating state.

When a VHF-band TV signal is received, the VHF-band TV signal received at an antenna (not shown) passes through the VHF-band high-frequency circuit section 32, is frequency-converted by the VHF-band mixer 40 and the VHF-band local oscillator 41 in the VHF-band frequency converter 33, is amplified by the intermediate-frequency amplifier 37 as an intermediate-frequency signal IF, and is output from the output terminal 39. The intermediate-frequency signal IF output from the output terminal 39 is detected by a detection circuit (not shown).

When a UHF-band TV signal is received, the UHF-band TV signal received at an antenna (not shown) passes through the UHF-band high-frequency circuit section 35, is frequency-converted by the UHF-band mixer 42 and the UHF-band local oscillator 43 in the UHF-band frequency converter 36, is amplified by the intermediate-frequency amplifier 37 as an intermediate-frequency signal IF, and is output from the output terminal 39. The intermediate-frequency signal IF output from the output terminal 39 is detected by a detection circuit (not shown).

In the above conventional V-U integrated-type TV-signal receiving tuner, since the distances between the circuits are short, isolation between the VHF-band frequency converter 33 and the UHF-band frequency converter 36 cannot be sufficiently provided. Therefore, an oscillation signal generated by the local oscillator of an operating frequency converter leaks to the not-operating frequency converter, and is emitted from the antenna to the air to give disturbance to other receivers.

When a VHF-band TV signal is received, an oscillation signal generated by the VHF-band local oscillator 41 leaks to the UHF-band frequency converter 36, and is emitted to the air through the UHF-band high-frequency circuit section 35 and the antenna. When a UHF-band TV signal is received, an oscillation signal generated by the UHF-band local oscillator 43 leaks to the VHF-band frequency converter 33, and is emitted to the air through the VHF-band high-frequency circuit section 32 and the antenna.

SUMMARY OF THE INVENTION

Accordingly, it is an object of the present invention to provide a TV-signal receiving tuner which prevents a case in which an oscillation signal generated by an operating local oscillator leaks to an not-operating frequency converter and is emitted to the air through an antenna as extraneous emission to give disturbance to other receivers.

The foregoing object is achieved by the present invention through the provision of a TV-signal receiving tuner for both VHF and UHF frequency bands, including a VHF-band frequency converter having a VHF-band mixer and a VHF-band local oscillator, for converting a VHF-band TV signal to a signal having an intermediate frequency; a UHF-band frequency converter having a UHF-band mixer and a UHF-band local oscillator, for converting a UHF-band TV signal to a signal having an intermediate frequency; and a band switcher for selectively operating the VHF-band frequency converter or the UHF-band frequency converter, wherein a switch circuit is provided for at least one of a previous stage of the VHF-band frequency converter and a previous stage of the UHF-band frequency converter; and the switch circuit passes a high-frequency signal when a frequency converter at a subsequent stage of the switch circuit is operating, and does not pass a high-frequency signal when the frequency converter at the subsequent stage of the switch circuit is not operating.

Therefore, even if an oscillation signal generated by the local oscillator of the operating frequency converter leaks to the not-operating frequency converter, the oscillation signal is not emitted from the antenna to the air. Extraneous emission is suppressed.

The TV-signal receiving tuner may be formed such that a VHF-band high-frequency circuit section is provided at a previous stage of the VHF-band frequency converter; a UHF-band high-frequency circuit section is provided at a previous stage of the UHF-band frequency converter; and the switch circuit is provided at at least one of a location between the VHF-band high-frequency circuit section and the VHF-band frequency converter, and a location between the UHF-band high-frequency circuit section and the UHF-band frequency converter.

In this case, since the oscillation signal which causes extraneous emission can be blocked near the emission source, extraneous emission is effectively reduced.

The TV-signal receiving tuner may be formed such that the switch circuit is provided at at least one of a location immediately before the VHF-band frequency converter and a location immediately before the UHF-band frequency converter.

In this case, the switch circuit can be combined with the frequency converter and other circuits into an integrated circuit to make the circuit compact.

The TV-signal receiving tuner may be formed such that the switch circuit includes a transmission line to which an input end and an output end of the switch circuit are connected, and a transistor or a diode for making and breaking a connection between the transmission line and the ground is provided.

The TV-signal receiving tuner may be formed such that the switch circuit is provided with a transistor or a diode for making and breaking a connection between an input end and an output end of the switch circuit.

In this case, since the switch circuit is formed of a transistor or a diode, the switch circuit is made compact and extraneous emission is suppressed without increasing the volume of the tuner.

The TV-signal receiving tuner may be formed such that the switch circuit includes a transmission line to which an input end and an output end of the switch circuit are connected; a first transistor or a first diode for making and breaking a connection between the transmission line and the ground is provided; a second transistor or a second diode for making and breaking a connection between the input end and the output end is provided; and when the connection between the transmission line and the ground is broken, the connection between the input end and the output end is made, and when the connection between the transmission line and the ground is made, the connection between the input end and the output end is broken.

In this case, since the transmission line of the switch circuit can be grounded and electrically disconnected at the same time, extraneous emission is further suppressed.

DESCRIPTION OF THE PREFERRED EMBODIMENT

Figure 1:
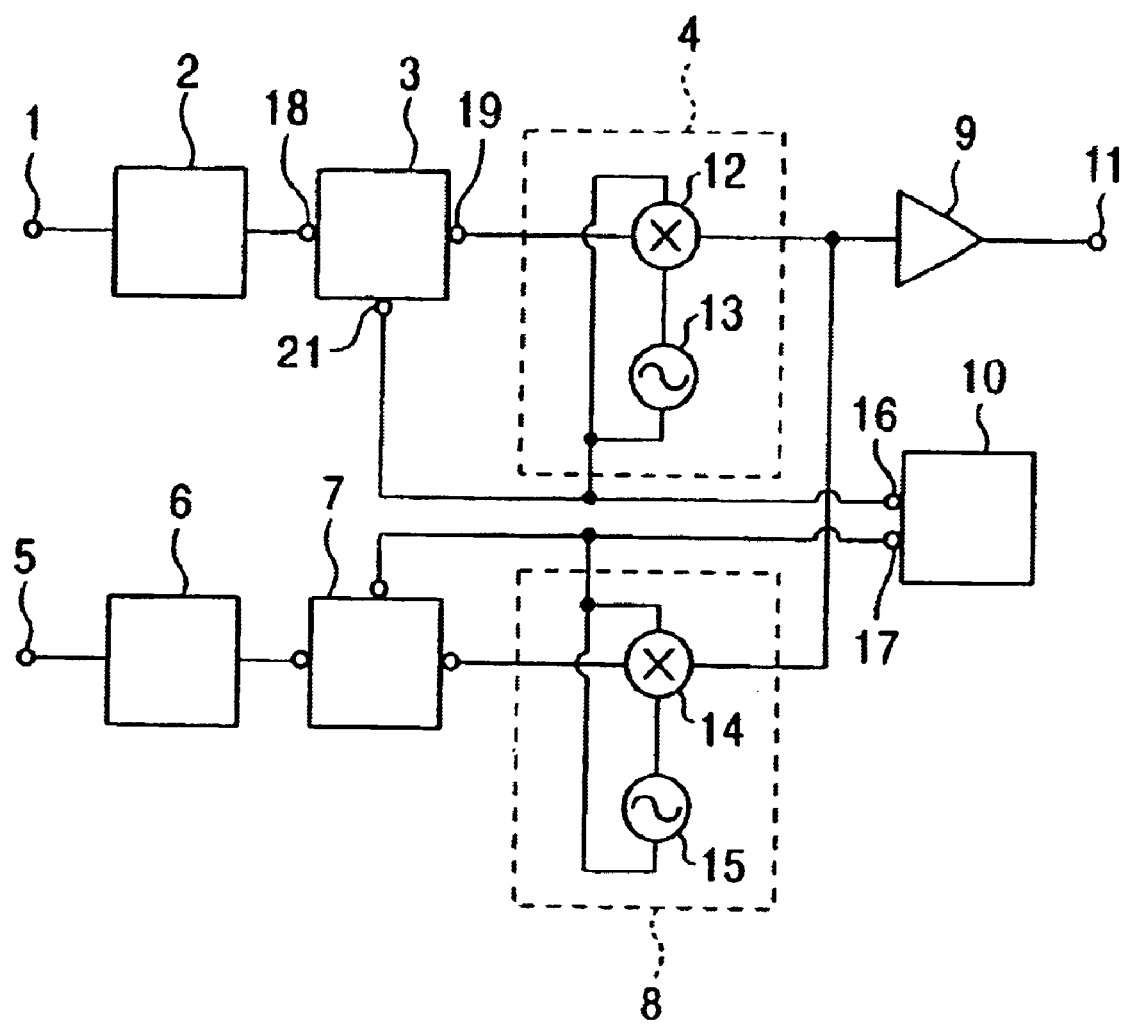
FIG. 1 is a block diagram of a TV-signal receiving tuner according to an embodiment of the present invention.

A TV-signal receiving tuner according to the present invention will be described below by referring to FIG. 1 to FIG. 5. FIG. 1 is a block diagram of a TV-signal receiving tuner according to the present invention. FIG. 2 to FIG. 5 are circuit diagrams of switch circuits used in the TV-signal receiving tuner of the present invention.

In FIG. 1, this V-U integrated-type TV-signal receiving tuner is formed by integrating a VHF-band TV-signal receiving tuner and a UHF-band TV-signal receiving tuner into one unit, and includes a VHF-band input terminal 1, a VHF-band high-frequency circuit section 2, a first switch circuit 3, a VHF-band frequency converter 4, a UHF-band input terminal 5, a UHF-band high-frequency circuit section 6, a second switch circuit 7, a UHF-band frequency converter 8, an intermediate-frequency amplifier 9, a band switcher 10, and an output terminal 11. The VHF-band frequency converter 4 has a VHF-band mixer 12 and a VHF-band local oscillator 13. The UHF-band frequency converter 8 has a UHF-band mixer 14 and a UHF-band local oscillator 15.

The VHF-band high-frequency circuit section 2 includes a high-frequency amplifier, a tuning circuit, and a filter (none of them are shown), selects a VHF-band TV signal to be received, and amplifies it.

In the same way, the UHF-band high-frequency circuit section 6 includes a high-frequency amplifier, a tuning circuit, and a filter (none of them are shown), selects a UHF-band TV signal to be received, and amplifies it.

A part of the TV-signal receiving tuner is formed in an integrated circuit to be made compact. The first switch circuit 3, the VHF-band frequency converter 4, the second switch circuit 7, the UHF-band frequency converter 8, the intermediate-frequency amplifier 9, the band switcher 10, and others are formed in the integrated circuit as a unit. Since the VHF-band high-frequency circuit section 2 and the UHF-band high-frequency circuit section 6 have filters, it is difficult to form them in the integrated circuit. They are formed outside the integrated circuit.

The band switcher 10 is connected to the first switch circuit 3, the VHF-band frequency converter 4, the second switch circuit 7, and the UHF-band frequency converter 8, and supplies a switching voltage according to the band to be received. When a VHF-band TV signal is to be received, the switching voltage is supplied only to a first control terminal 16, the switching voltage is supplied to the VHF-band frequency converter 4, and the VHF-band frequency converter 4 is set to an operating state. At the same time, the switching voltage is sent to the first switch circuit 3, and the first switch circuit 3 is set such that the VHF-band TV signal output from the VHF-band high-frequency circuit section 2 passes through the first switch circuit 3 and is input to the VHF-band frequency converter 4. In this case, the switching voltage is not supplied to a second control terminal 17, and therefore, the UHF-band frequency converter 8 does not operate and the second switch circuit 7 is set such that a UHF-band TV signal leaking from the UHF-band high-frequency circuit section 6 cannot pass through the second switch circuit 7.

In the same way, when a UHF-band TV signal is to be received, the switching voltage is supplied only to the second control terminal 17, the switching voltage is supplied to the UHF-band frequency converter 8, and the UHF-band frequency converter 8 is set to an operating state. At the same time, the switching voltage is sent to the second switch circuit 7, and the second switch circuit 7 is set such that the UHF-band TV signal output from the UHF-band high-frequency circuit section 6 passes through the second switch circuit 7 and is input to the UHF-band frequency converter 8. In this case, the switching voltage is not supplied to the first control terminal 16, and therefore, the VHF-band frequency converter 4 does not operate and the first switch circuit 3 is set such that a VHF-band TV signal leaking from the VHF-band high-frequency circuit section 2 cannot pass through the first switch circuit 3.

When a VHF-band TV signal is received, the VHF-band TV signal received at an antenna (not shown) passes through the VHF-band high-frequency circuit section 2 and then the first switch circuit 3, is frequency-converted by the VHF-band mixer 12 and the VHF-band local oscillator 13 in the VHF-band frequency converter 4, is amplified by the intermediate-frequency amplifier 9 as an intermediate-frequency signal IF, and is output from the output terminal 11. The intermediate-frequency signal IF output from the output terminal 11 is detected by a detection circuit (not shown).

In this case, since the second switch circuit 7 is set such that a signal cannot pass through the second switch circuit 7, even if an oscillation signal generated by the VHF-band local oscillator 13 leaks to the UHF-band frequency converter 8, the leakage is blocked by the second switch circuit 7. The leakage does not reach the antenna and extraneous emission is reduced.

When a UHF-band TV signal is received, the UHF-band TV signal received at an antenna (not shown) passes through the UHF-band high-frequency circuit section 6 and then the second switch circuit 7, is frequency-converted by the UHF-band mixer 14 and the UHF-band local oscillator 15 in the UHF-band frequency converter 8, is amplified by the intermediate-frequency amplifier 9 as an intermediate-frequency signal IF, and is output from the output terminal 11. The intermediate-frequency signal IF output from the output terminal 11 is detected by a detection circuit (not shown).

In this case, since the first switch circuit 3 is set such that a signal cannot pass through the first switch circuit 3, even if an oscillation signal generated by the UHF-band local oscillator 15 leaks to the VHF-band frequency converter 4, the leakage is blocked by the first switch circuit 3. The leakage does not reach the antenna and extraneous emission is reduced.

Figure 2:
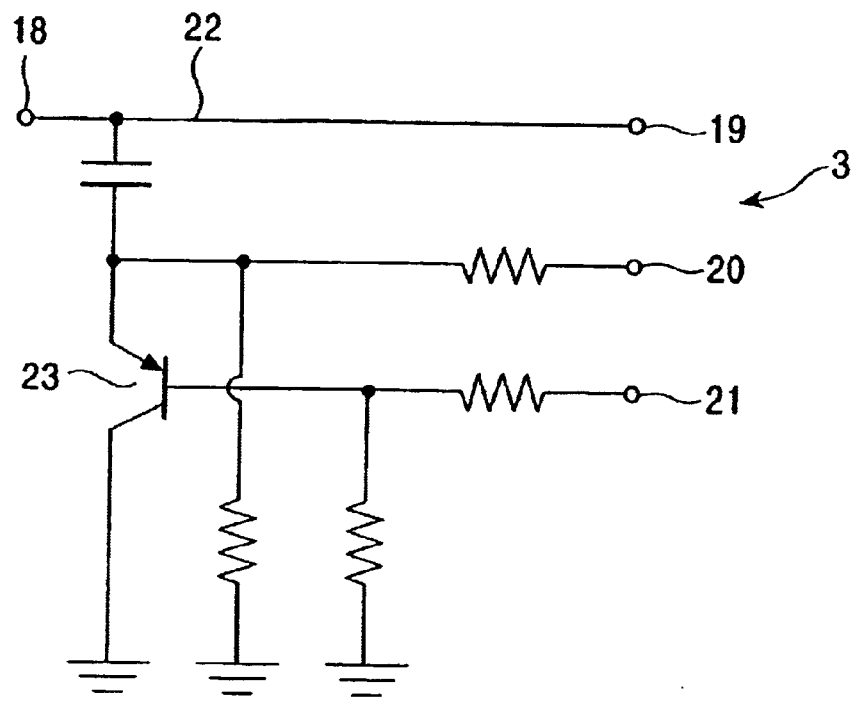
FIG. 2 is a circuit diagram of a switch circuit used in the TV-signal receiving tuner according to the present embodiment.

Specific examples of the first switch circuit 3 will be described next by referring to FIG. 2 to FIG. 4. Since the second switch circuit 7 has the same structure as the first switch circuit 3, descriptions thereof will be omitted. A switch circuit shown in FIG. 2 includes a transistor which shunts a signal to the ground. A PNP transistor 23 is connected between the ground and a transmission line 22 connected to an input terminal 18 and an output terminal 19 of the switch circuit to shunt a signal on the transmission line to the ground. A power-source voltage is sent to the emitter of the transistor 23 through a power-source supply terminal 20, and the switching voltage is sent to the base through a switching-voltage input terminal 21.

In the above structure, when a VHF-band TV signal is to be received, the switching voltage is sent to the base of the transistor 23 from the band switcher 10 through the switching-voltage input terminal 21. Then, the emitter of the transistor 23 is electrically disconnected from the collector. A VHF-band TV signal input to the input terminal 18 passes through the transmission line 22 and is output from the output terminal 19.

When a UHF-band TV signal is to be received, the switching voltage is not sent from the band switcher 10 to the switching-voltage input terminal 21. Therefore, the emitter of the transistor 23 is electrically connected to the collector, the transmission line 22 is grounded, and a signal cannot pass through the transmission line 22. Consequently, even if an oscillation signal generated by the UHF-band local oscillator 15 is input to the output terminal 19 through the VHF-band frequency converter 4, the signal does not reach the input terminal 18. The oscillation signal of the UHF-band local oscillator 15 is prevented from leaking from the antenna to the air.

Figure 3:
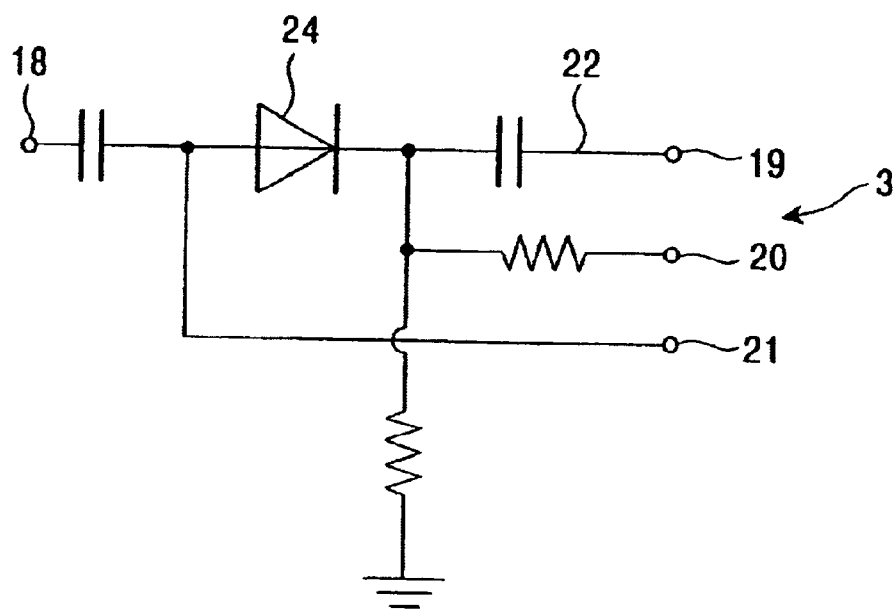
FIG. 3 is a circuit diagram of another switch circuit used in the TV-signal receiving tuner according to the present embodiment.

FIG. 3 shows a structure in which a diode is used to connect an input terminal 18 and an output terminal 19 or to disconnect them. A diode 24 is provided at the middle of a transmission line connected to the input terminal 18 and to the output terminal 19. A power-source voltage is sent to the cathode of the diode 24 from a power-source supply terminal 20, and the switching voltage is sent to the anode from a switching-voltage input terminal 21.

In the above structure, when a VHF-band TV signal is to be received, the switching voltage is sent to the anode of the diode 24 from the band switcher 10 through the switching-voltage input terminal 21. Then, the diode 24 becomes a continuity state. A VHF-band TV signal input to the input terminal 18 passes through the transmission line 22 and is output from the output terminal 19.

When a UHF-band TV signal is to be received, the switching voltage is not sent from the band switcher 10 to the switching-voltage input terminal 21. Therefore, the diode 24 becomes a non-continuity state, and a signal cannot pass through the transmission line 22. Consequently, even if an oscillation signal generated by the UHF-band local oscillator 15 is input to the output terminal 19 through the VHF-band frequency converter 4, the signal does not reach the input terminal 18. The oscillation signal of the UHF-band local oscillator 15 is prevented from leaking from the antenna to the air.

Figure 4:
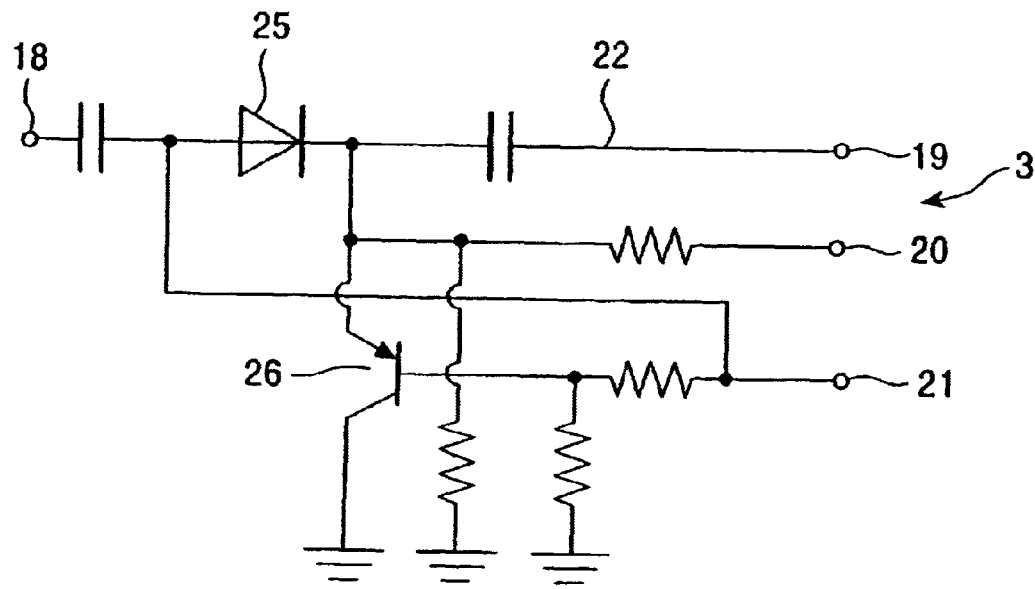
FIG. 4 is a circuit diagram of yet another switch circuit used in the TV-signal receiving tuner according to the present embodiment.

FIG. 4 shows a structure in which a transistor for shunting a signal to the ground and a diode for connecting an input terminal and an output terminal and for disconnecting them are provided. A diode 25 is inserted at the middle of a transmission line 22 connecting an input terminal 18 and an output terminal 19, and a PNP transistor 26 is connected between the transmission line 22 and the ground. A power-source voltage is supplied from a power-source supply terminal 20 and the switching voltage is sent from a switching-voltage input terminal 21, to the diode 25 and to the transistor 26.

In the above structure, when a VHF-band TV signal is to be received, the switching voltage is sent to the anode of the diode 25 and to the base of the transistor 26 from the band switcher 10 through the switching-voltage input terminal 21. Then, the diode 25 becomes a continuity state and the emitter of the transistor 26 is electrically not connected to the collector. As a result, a VHF-band TV signal input to the input terminal 18 passes through the transmission line 22 and is output from the output terminal 19.

When a UHF-band TV signal is to be received, the switching voltage is not sent from the band switcher 10 to the switching-voltage input terminal 21. Therefore, the diode 25 becomes a non-continuity state, the emitter of the transistor 26 is electrically connected to the collector, and the transmission line is grounded. Consequently, even if an oscillation signal generated by the UHF-band local oscillator 15 is input to the output terminal 19 through the VHF-band frequency converter 4, the signal does not reach the input terminal 18. The oscillation signal of the UHF-band local oscillator 15 is prevented from leaking from the antenna to the air.

Figure 5:
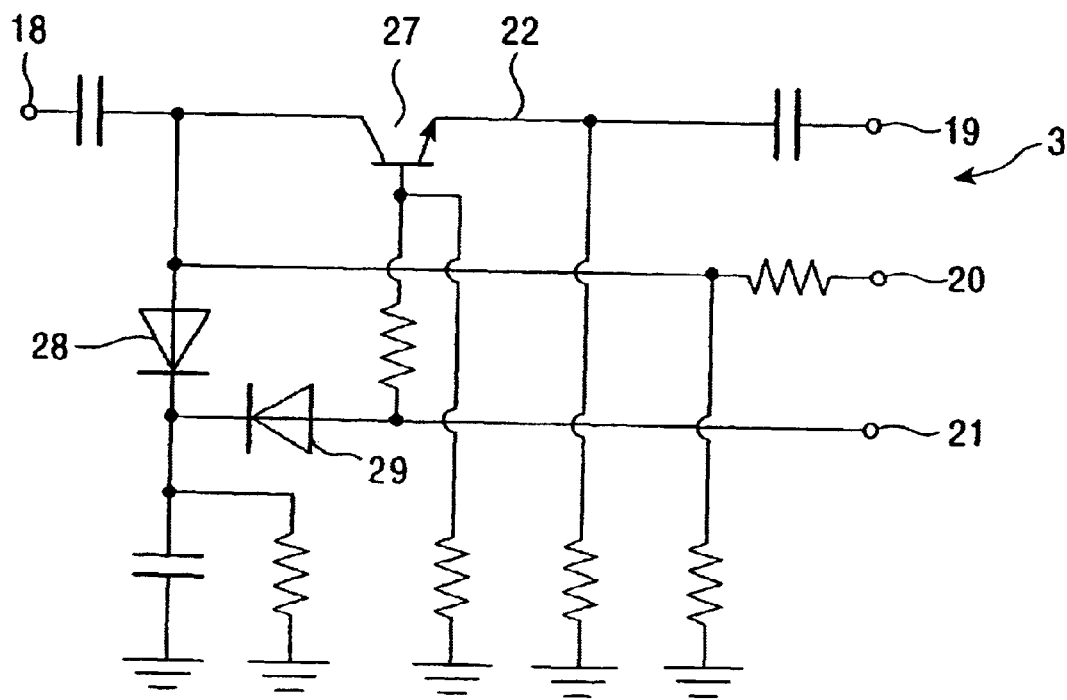
FIG. 5 is a circuit diagram of still another switch circuit used in the TV-signal receiving tuner according to the present embodiment.
Figure 6:
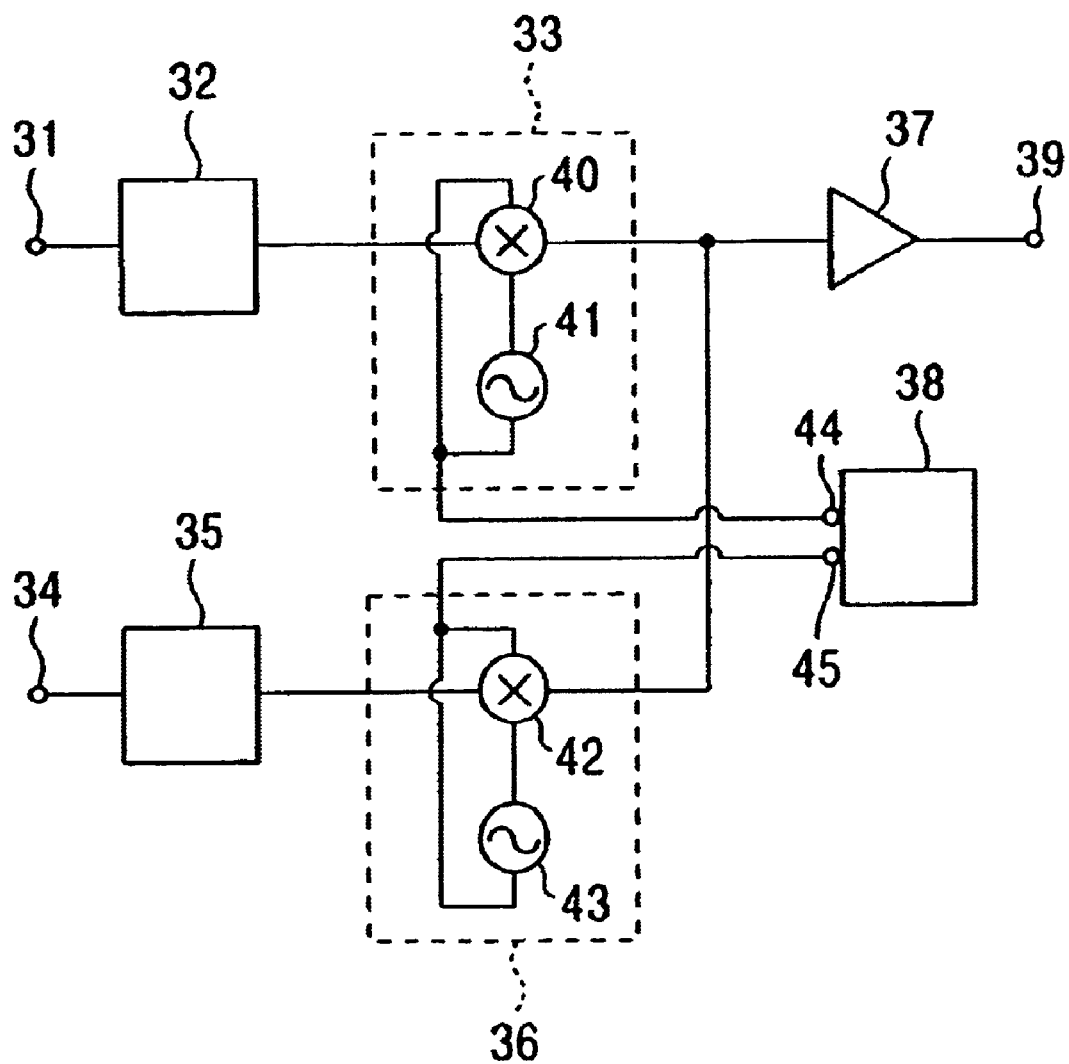
FIG. 6 is a block diagram of a conventional TV-signal receiving tuner.

FIG. 5 shows a structure in which a diode for shunting a signal to the ground and a transistor for connecting an input terminal and an output terminal and for disconnecting them are provided. An NPN transistor 27 is inserted at the middle of a transmission line 22 connecting an input terminal 18 and an output terminal 19, and a diode 28 is connected between the transmission line 22 and the ground, and a diode 29 is connected between the cathode of the diode 28 and the switching-voltage input terminal 21. A power-source voltage is supplied from a power-source supply terminal 20 and the switching voltage is sent from a switching-voltage input terminal 21, to the transistor 27 and to the diode 28.

In the above structure, when a VHF-band TV signal is to be received, the switching voltage is sent to the base of the transistor 27 and through the diode 29 to the cathode of the diode 28 from the band switcher 10 through the switching-voltage input terminal 21. Then, the diode 29 becomes a continuity state, the transistor 27 becomes a continuity state and the diode 28 becomes a non-continuity state. As a result, a TV signal input to the input terminal 18 passes through the transmission line 22 and is output from the output terminal 19.

When a UHF-band TV signal is to be received, the switching voltage is not sent from the band switcher 10 to the switching-voltage input terminal 21. Therefore, the diode 29 becomes a non-continuity state, the transistor 27 becomes a non-continuity state, the diode 28 becomes a continuity state, and the transmission line is grounded. Consequently, even if an oscillation signal generated by the UHF-band local oscillator 15 is input to the output terminal 19 through the VHF-band frequency converter 4, the signal does not reach the input terminal 18. The oscillation signal of the UHF-band local oscillator 15 is prevented from leaking from the antenna to the air.

All of the example switch circuits shown in FIG. 2 to FIG. 5 prevent an oscillation signal generated by the local oscillator from leaking from the antenna to the air. Since the switch circuits shown in FIG. 4 and FIG. 5 disconnect the transmission line 22 at the middle and ground it, they suppress extraneous emission to a lower level than that in the switch circuits shown in FIG. 2 and FIG. 3.

A switch circuit may be provided at a previous stage of a high-frequency circuit section. Since the high-frequency circuit section has a filter, it is difficult to put the high-frequency circuit section into an integrated circuit. It is easier to make a circuit compact when a switch circuit is provided at a subsequent stage of the high-frequency circuit section and the switch circuit is integrated together with a frequency converter.

A TV-signal receiving tuner of the present invention is not limited to those described above. Various modifications can be made within the scope of the present invention.

What is claimed is:

1. A TV signal receiving tuner for both of VHF and UHF frequency bands comprising:
    a VHF-band input terminal;
    a VHF-band high-frequency circuit section connected to said VHF-band input terminal;
    a UHF-band input terminal;
    a UHF-band high-frequency circuit section connected to said UHF-band input terminal;
    a VHF-band frequency converter having a VHF-band mixer and a VHF-band local oscillator for converting a VHF-band TV signal to a signal having an intermediate frequency;
    a UHF-band frequency converter having a UHF-band mixer and a UHF-band local oscillator for converting a UHF-band TV signal to a signal having an intermediate frequency; and
    a band switcher for selectively operating said VHF-band frequency converter or said UHF-band frequency converter,
    wherein a switch circuit is provided at, at least one of, between said VHF-band high-frequency circuit section and a previous stage of said VHF-band frequency converter and between said UHF-band high-frequency circuit section and a previous stage of said UHF-band frequency converter; and
    the switch circuit has an input terminal and an output terminal, is provided with a transmission line for a high-frequency signal between the input terminal with the output terminal, is provided with a switch transistor or a switch diode between the transmission line and the ground, allows a passage of the high-frequency signal between the input terminal and the output terminal when a frequency converter at a subsequent stage of the switch circuit is operating, and blocks the passage of the high-frequency signal when the frequency converter at the subsequent stage of the switch circuit is not operating.

2. A TV signal receiving tuner for both VHF and UHF frequency bands comprising:
    a VHF-band input terminal;
    a VHF-band high-frequency circuit section connected to said VHF-band input terminal;
    a UHF-band input terminal;
    a UHF-band high-frequency circuit section connected to said UHF-band input terminal;
    a VHF-band frequency converter having a VHF-band mixer and a VHF-band local oscillator for converting a VHF-band TV signal to a signal having an intermediate frequency;
    a UHF-band frequency converter having a UHF-band mixer and a UHF-band local oscillator for converting a UHF-band TV signal to a signal having an intermediate frequency; and
    a band switcher for selectively operating said VHF-band frequency converter or said UHF-band frequency converter,
    wherein a switch circuit is provided at, at least one of, between said VHF-band high-frequency circuit section and a previous stage of said VHF-band frequency converter and between said UHF-band high-frequency circuit section and a previous stage of said UHF-band frequency converter; and
    the switch circuit has an input terminal and an output terminal, is provided with a switch transistor or a switch diode and a transmission line for a high-frequency signal between the input terminal and the output terminal, allows a passage of the high-frequency signal between the input terminal and the output terminal when a frequency converter at a subsequent stage of the switch circuit is operating, and blocks a passage of the high-frequency signal when the frequency converter at the subsequent stage of the switch circuit is not operating.

3. A TV signal receiving tuner for both VHF and UHF frequency bands comprising:
    a VHF-band input terminal;
    a VHF-band high-frequency circuit section connected to said VHF-band input terminal;

a UHF-band input terminal;

a UHF-band high-frequency circuit section connected to said UHF-band input terminal;

a VHF-band frequency converter having a VHF-band mixer and a VHF-band local oscillator for converting a VHF-band TV signal to a signal having an intermediate frequency;

a UHF-band frequency converter having a UHF-band mixer and a UHF-band local oscillator for converting a UHF-band TV signal to a signal having an intermediate frequency; and a band switcher for selectively operating said VHF-band frequency converter or said UHF-band frequency converter, wherein a switch circuit is provided at, at least one of, between said VHF-band high-frequency circuit section and a previous stage of said VHF-band frequency converter and between said UHF-band high-frequency circuit section and a previous stage of said UHF-band frequency converter; and the switch circuit has an input terminal and an output terminal, has a transmission line for a high-frequency signal between the input terminal and the output terminal, is provided with a switch transistor or a switch diode between the transmission line and the ground, is provided with a switch transistor or a switch diode between the input terminal and the output terminal, allows a passage of the high-frequency signal between the input terminal and the output terminal when a frequency converter at a subsequent stage of the switch circuit is operating, and blocks the passage of the high-frequency signal when the frequency converter at the subsequent stage of the switch circuit is not operating.

* * * * *